(12) United States Patent
Liu et al.

(10) Patent No.: US 11,299,672 B2
(45) Date of Patent: Apr. 12, 2022

(54) NEAR-INFRARED LUMINESCENT MATERIAL AND LIGHT-EMITTING DEVICE PREPARED THEREFROM

(71) Applicants: GRIREM ADVANCED MATERIALS CO., LTD., Beijing (CN); GUOKE RE ADVANCED MATERIALS CO., LTD., Langfang (CN)

(72) Inventors: Ronghui Liu, Beijing (CN); Xiaoxia Chen, Beijing (CN); Yuanhong Liu, Beijing (CN); Yanfeng Li, Beijing (CN); Xiaole Ma, Beijing (CN)

(73) Assignees: GRIREM ADVANCED MATERIALS CO., LTD., Beijing (CN); GUOKE RE ADVANCED MATERIALS CO., LTD., Langfang (CN)

( * ) Notice: Subject to any disclaimer, the term of this patent is extended or adjusted under 35 U.S.C. 154(b) by 52 days.

(21) Appl. No.: 16/612,315

(22) PCT Filed: Sep. 13, 2018

(86) PCT No.: PCT/CN2018/105573
§ 371 (c)(1),
(2) Date: Nov. 8, 2019

(87) PCT Pub. No.: WO2019/153742
PCT Pub. Date: Aug. 15, 2019

(65) Prior Publication Data
US 2020/0362239 A1  Nov. 19, 2020

(30) Foreign Application Priority Data

Feb. 12, 2018 (CN) .......................... 201810147400.3

(51) Int. Cl.
*H01L 33/50* (2010.01)
*C09K 11/77* (2006.01)

(52) U.S. Cl.
CPC ........ *C09K 11/7776* (2013.01); *H01L 33/504* (2013.01)

(58) Field of Classification Search
CPC ................ C09K 11/7776; C09K 11/06; H01L 33/504; H01L 33/502
See application file for complete search history.

(56) References Cited

U.S. PATENT DOCUMENTS

2012/0262648 A1* 10/2012 Hirosaki ............. C01B 21/0823
349/71
2013/0113011 A1*  5/2013 Dutta ................. C09K 11/7731
977/774

(Continued)

FOREIGN PATENT DOCUMENTS

CN       103194232 A      7/2013
CN       103855288 A      6/2014
(Continued)

OTHER PUBLICATIONS

International Search Report of PCT/CN2018/105573.
Written Opinion of PCT/CN2018/105573.

*Primary Examiner* — Eugene Lee
(74) *Attorney, Agent, or Firm* — Dragon Sun Law Firm, PC; Jinggao Li, Esq.

(57) ABSTRACT

The near-infrared luminescent material is capable of efficiently emitting near-infrared light with a peak wavelength of 900 nm to 1,100 nm under an effective excitation wavelength of 250 nm to 750 nm. The luminescent material has the characteristics of wide excitation emission wavelength, high luminous efficiency, uniform luminescence, no impurity phase, high stability, simple preparation and the like. The present invention further provides the light-emitting device prepared from the near-infrared luminescent material. The luminescent material and the light-emitting device provided by the present invention solve the problems of poor (Continued)

stability, low luminous efficiency, high preparation cost and the like of a conventional near-infrared luminescent material and light-emitting device, and have a favorable application prospect.

20 Claims, 2 Drawing Sheets

(56) References Cited

U.S. PATENT DOCUMENTS

| | | | | |
|---|---|---|---|---|
| 2015/0372240 A1* | 12/2015 | Lub | ............... | H05B 33/12 546/37 |
| 2016/0079490 A1* | 3/2016 | De Boer | ............... | H01L 33/508 257/88 |
| 2017/0133563 A1* | 5/2017 | Chung | ............... | H01L 33/56 |

FOREIGN PATENT DOCUMENTS

| | | |
|---|---|---|
| CN | 104136573 A | 11/2014 |
| CN | 106867537 A | 6/2017 |
| CN | 107142107 A | 9/2017 |
| EP | 3045511 A1 | 7/2016 |

* cited by examiner

NEAR-INFRARED LUMINESCENT MATERIAL AND LIGHT-EMITTING DEVICE PREPARED THEREFROM

CROSS-REFERENCE TO RELATED APPLICATIONS

This application is a national stage application of PCT Application No. PCT/CN2018/105573. This Application claims priority from PCT Application No. PCT/CN2018/105573 filed Sep. 13, 2018, and CN 201810147400.3 filed Feb. 12, 2018, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention belongs to the technical field of luminescent materials, particularly relates to a near-infrared luminescent material which can be effectively excited by ultraviolet visible light to emit broadband near-infrared light, and further discloses a light-emitting device prepared from the near-infrared luminescent material.

BACKGROUND

In recent years, with the in-depth study in the near-infrared field (700 nm to 2,500 nm) and the expansion of its application range, especially with the development in the fields of fiber-optic communication, plant lighting, facial recognition, iris recognition, security and protection monitoring, laser radar, digital health, 3D sensing, synergism of solar cells, anti-counterfeiting, etc., there is an urgent need to develop a more efficient and stable near-infrared luminescence technology.

The existing methods of acquiring near-infrared short-wave light mainly include light splitting by infrared chips or halogen lamps. However, an infrared chip used in a conventional near-infrared light-emitting device has problems of low excitation efficiency, high cost, and the like. Since the use of a halogen lamp requires light filtering, most of light will be split, resulting in low use efficiency. Meanwhile, since the halogen lamp generates lots of heat, it cannot be applied to a small device.

In comparison with light splitting by the infrared chips and the halogen lamps, a near-infrared light-emitting device prepared from photoluminescent transition metal or rare-earth metal oxides or electroluminescent organic complexes (Chemistry Letters, 2004, 33: 50-51; Advanced Functional Materials, 2002, 12: 745-751; Academic Annual Meeting of the Chinese Chemical Society, 2016) is relatively higher in luminous efficiency and relatively lower in cost. However, an organic complex luminescent material is characterized by poor thermal stability and poor light stability.

At present, owing to their advantages of excellent thermal stability, stable chemical structures, etc., aluminate and gallate of garnet structures are widely used as base materials of luminescent materials, light can be emitted in different wavebands from green light, yellow light, red light and near-infrared light by adding different activator ions. $Yb^{3+}$ as an activator ion can emit near-infrared light of about 1,000 nm due to its $2F5/2 \rightarrow 2F7/2$ energy level transition. In the aluminate and gallate base materials, Haohai Yu et al. (Haohai Yu, Kui Wu, Bin Yao, Huaijin Zhang, Zhengping Wang, Jiyang Wang, Yongdong Zhang, Zhiyi Wei, Zhiguo Zhang, Xingyu Zhang, and Minhua Jiang. Growth and Characteristics of Yb-doped $Y_3Ga_5O_{12}$ Laser Crystal, IEEE JOURNAL OF QUANTUM ELECTRONICS, VOL. 46, NO. 12, DECEMBER 2010) studied Yb-doped laser crystals in YGG (Yttrium Gallium Garnet) and YAG (Yttrium Aluminum Garnet), and found that the crystals can absorb light of 970 nm and emit light of about 1000 nm. However, the crystals cannot efficiently absorb light to emit light under excitation light sources of ultraviolet light, blue light, red light and the like.

Thus, it is necessary to develop and research an inorganic near-infrared emitting material with high luminous efficiency, simple preparation process and high stability, as well as a light-emitting device prepared from the material, which is of positive significance.

SUMMARY

A technical problem to be solved by the present invention is to provide a luminescent material, which has stable chemical properties and excellent luminescent properties, can be effectively excited by ultraviolet visible light and can efficiently emit near-infrared light.

The other technical problem to be solved by the present invention is to further provide a light-emitting device prepared from the near-infrared luminescent material to solve the problems of poor stability, low luminous efficiency, high preparation cost and the like of a near-infrared chip, a halogen lamp and other near-infrared luminescent materials in the prior art.

To solve the above technical problems, the near-infrared luminescent material provided by the present invention includes an inorganic compound with a chemical formula of $R_uQ_vO_w:Cr_x, Yb_y$.

R is at least one of Y, La, Lu, Gd and Tb.

Q is Ga and/or Al.

The parameters u, v, w, x and y meet the following conditions: $2.5 \leq u \leq 3.5$, $3.5 \leq v \leq 5.5$, $11.25 \leq w \leq 13.25$, $0.02 \leq x \leq 0.30$, and $0.02 \leq y \leq 0.30$.

Preferably, in the near-infrared luminescent material, Q is Ga.

Preferably, in the near-infrared luminescent material, Q is a combination of Ga and Al. A mole percent of Ga to Al is j, and $80\% \leq j < 100\%$.

Preferably, in the near-infrared luminescent material, R is Y, Tb or Lu. Or, R is a combination of Y and Tb or a combination of Y and Lu.

Preferably, in the near-infrared luminescent material, R comprises Tb and/or Lu.

More preferably, in the near-infrared luminescent material, the parameters x and y meet the following condition: $0.15 \leq y/x \leq 2$, preferably, $0.3 \leq y/x \leq 1$.

More preferably, in the near-infrared luminescent material, the parameters u, v, x and y meet the following condition: $1.2 \leq (v+x)/(u+y) \leq 1.65$, preferably, $1.45 \leq (v+x)/(u+y) \leq 1.60$.

Preferably, the near-infrared luminescent material further includes Ba and/or F.

The near-infrared luminescent material provided by the present invention is prepared by the following steps: accurately weighing raw materials, wherein the raw materials include an oxide, a fluoride, a carbonate or a chloride of R, an oxide, a fluoride, a carbonate or a chloride of Q, an oxide, a fluoride or a carbonate of Cr and an oxide, a fluoride or a carbonate of Yb according to a stoichiometric proportion; roasting the weighed raw materials for 2 h to 20 h in an air, nitrogen and/or hydrogen atmosphere at 1,400° C. to 1,500° C. to obtain a roasted product; and performing aftertreatment on the roasted product to obtain a required fluorescent powder. The aftertreatment includes crushing, washing (water washing, weak acid washing or the like), grading, etc.

The near-infrared luminescent material provided by the present invention may be prepared by a method in the prior art or a new method to be discovered in the future.

The near-infrared luminescent material provided by the present invention has a peak-peak intensity A in an emission spectrum within the range of 900 nm to 1,100 nm, and a peak-peak intensity B in an emission spectrum within the range of 700 nm to 750 nm, wherein 0.95≤A/(A+B)≤0.99.

The present invention further discloses use of the near-infrared luminescent material for preparation of a light-emitting device.

The near-infrared luminescent material provided by the present invention can be configured to prepare the light-emitting device. The light-emitting device prepared from the near-infrared luminescent material can be used in the fields of fiber-optic communication, plant lighting, facial recognition, iris recognition, security and protection monitoring, anti-counterfeiting, laser radar, food detection, digital health, 3D sensing, synergism of solar cells, etc.

The present invention further discloses a light-emitting device, including a phosphor and an excitation light source. The phosphor includes the near-infrared luminescent material described above.

In particular, the light-emitting device includes a semiconductor chip, a light conversion portion I and a light conversion portion II. The light conversion portion I absorbs primary light emitted by the semiconductor chip and converts the absorbed primary light into secondary light with a larger wavelength. The light conversion portion II absorbs the primary light from the semiconductor chip and the secondary light emitted by the light conversion portion I and converts the absorbed light into thrice light with a larger wavelength.

The light conversion portion I at least includes a luminescent material I. The light conversion portion II at least includes the near-infrared luminescent material.

More preferably, under excitation of the semiconductor chip, the luminescent material I is capable of emitting light with a peak wavelength of 580 nm to 650 nm.

More preferably, the luminescent material I is one or two of luminescent materials with the following general formulas: $M_mAl_aSi_bN_c:Eu_d$ and $M_eSi_fN_g:Eu_n$.

M is selected from Ca and/or Sr.

The parameters m, a, b, c, d, e, f, g and n meet the following conditions: 0.8≤m≤1.2, 0.8≤a≤1.2, 0.8≤b≤1.2, 2≤c≤4, 0.0001≤d≤0.1, 1.8≤e≤2.2, 4≤f≤6, 7≤g≤9, and 0.0001≤n≤0.1.

More preferably, the luminescent material I adopts a crystal structure as $CaAlSiN_3$ or $Sr_2Si_5N_8$.

More preferably, in the luminescent material I, M is a combination of Ca and Sr. A mole percent of Sr to M is z, and 80%≤z<100%.

The luminescent material I provided by the present invention may be prepared by a method in the prior art or a new method to be discovered in the future.

Preferably, in the light-emitting device, the light conversion portion I only includes a luminescent material I.

Preferably, in the light-emitting device, the light conversion portion II only includes the near-infrared luminescent material.

Since the luminescent material I and the near-infrared luminescent material are used simultaneously, the light-emitting device has a broader infrared emission spectrum and a unique function.

As a preferred solution, the semiconductor chip has an emission peak wavelength range of 350 nm to 500 nm and/or 550 nm to 700 nm, preferably 430 nm to 465 nm.

The near-infrared luminescent material provided by the present invention includes the inorganic compound with the chemical formula of $R_uQ_vO_w:Cr_x,Yb_y$, has an excitation wavelength of 300 nm to 700 nm and can perform efficient emission (900 nm to 1,100 nm) in a near-infrared region. With a relatively wider excitation wavelength, the near-infrared luminescent material can efficiently absorb ultraviolet-visible light. Compared with a near-infrared organic luminescent material and other system inorganic luminescent materials, the near-infrared luminescent material can emit near-infrared light more strongly. Moreover, the near-infrared luminescent material has excellent thermal resistance, water resistance and light stability, is simple in preparation process and relatively lower in cost, and thus, is an ideal application material for a near-infrared device.

With the application of the technical solution provided by the present invention, the light-emitting device described above can obtain near-infrared light under excitation of different blue light, near ultraviolet light and red light. It not only can be applied to the fields of near fiber-optic communication, plant lighting, facial recognition, iris recognition, security and protection monitoring, anti-counterfeiting, laser radar, food detection, digital health, 3D sensing, synergism of solar cells, etc., but also avoids the defects of other near-infrared acquisition modes. The light-emitting device provided by the present invention is high in luminous efficiency and low in cost, and is applicable to various devices.

BRIEF DESCRIPTION OF THE DRAWINGS

In order to make the content of the present invention easier to understand, the present invention will be further described in detail below based on specific embodiments of the present invention in conjunction with the accompanying drawings.

The accompanying drawings illustrate one or more embodiments of the present invention and, together with the written description, serve to explain the principles of the invention. Wherever possible, the same reference numbers are used throughout the drawings to refer to the same or like elements of an embodiment.

Figure 1:
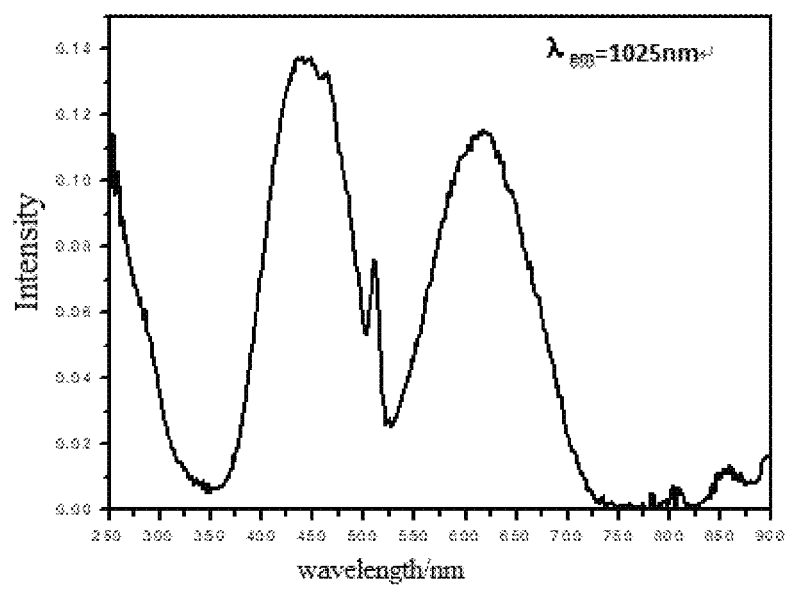
FIG. 1 is an excitation spectrum chart of a near-infrared luminescent material with a monitoring wavelength of 1,025 nm according to Embodiment 1 of the present invention.

The reference signs in the drawings represent the following components: 1—light conversion portion I; 2—semiconductor chip; 3—pin; 4—heat sink; 5—base; 6—light conversion portion II; and 7—plastic lens.

DETAILED DESCRIPTION

To facilitate understanding of the present invention, the following embodiments of the present invention are listed. It should be understood by those skilled in the art that these embodiments are only intended to help understand the present invention and by no means are to be construed as any specific limitation on the present invention.

It should be noted that in case of no conflict, the embodiments and features in the embodiments of the present application can be combined with each other. The present invention will be illustrated in detail below with reference to the embodiments.

As introduced in BACKGROUND, the problems of low excitation efficiency, high cost and the like exist in an infrared chip used in a conventional near-infrared luminescent device. Since the use of a halogen lamp requires light filtering, most of light will be split to result in low use efficiency. Meanwhile, since the halogen lamp generates lots of heat, it cannot be applied to a small device. A conventional electroluminescent material device and technology are not mature, and the low luminous efficiency and poor stability in the infrared spectrum are still the biggest bottleneck restricting its application. In a typical implementation mode of the present invention, a near-infrared luminescent material is provided. The luminescent material includes an inorganic compound with a chemical formula of $R_uQ_vO_w$:$Cr_x,Yb_y$. R is one or a combination of two or more of Y, La, Lu, Gd and Tb. Q is one or both of Ga and Al, wherein $2.5 \leq u \leq 3.5$, $3.5 \leq v \leq 5.5$, $11.25 \leq w \leq 13.25$, $0.02 \leq x \leq 0.30$, and $0.02 \leq y \leq 0.30$.

A conventional near-infrared luminescent material that is single-doped with Yb has relatively lower quantum efficiency, which limits its application. An effective way to overcome this shortcoming is to co-dope such broadband emission rare-earth elements as $Cr^{3+}$ in the above-mentioned near-infrared luminescent material, and to improve the quantum efficiency and emission intensity by a resonance energy transfer between a sensitizer $Cr^{3+}$ and an activator Yb. With the application of the technical solution provided by the present invention, by optimizing the proportion of R, Q and O, as well as the proportion of ions of the sensitizer and the activator, the activator can obtain higher transition energy. Thus, the problem of low luminous efficiency of a current nitride luminescent material is solved. Emission with higher luminous efficiency is obtained.

In the above aluminate or gallate luminescent material provided by the present invention, its crystal structure is generally a garnet structure. In order to make the luminescent material provided by the present invention have a garnet crystal structure without introducing other impurity phases, when R is one or two of such trivalent rare-earth elements as Y, La, Lu, Gd and Tb, Q is one or both of Ga and Al. Thus, strict growth of a crystal lattice of the luminescent material can be guaranteed to obtain a high-stability luminescent material. However, the introduction amounts of the above elements should be appropriate, and have to meet the following conditions: $2.5 \leq u \leq 3.5$, $3.5 \leq v \leq 5.5$, and $11.25 \leq w \leq 13.25$. If the components are not within this range, the luminescent material may not produce a pure phase due to its component differences. As a result, the properties of the luminescent material will be poor.

In the above aluminate or gallate luminescent material provided by the present invention, $Yb^{3+}$ is used as an activator ion, and $Cr^{3+}$ is used as a sensitizer ion. After many experiments, it is found that an optimal effect can be achieved when concentration ranges of the activator and the sensitizer are limited that $0.02 \leq x \leq 0.30$ and $0.02 \leq y \leq 0.30$ respectively. When the content of y is more than 0.3, on the one hand, after entry into the crystal lattice, the structural instability is increased and even impurity phases are produced due to ion radius mismatch; and on the other hand, too much activator ions will produce a concentration quenching effect, and the luminance decreases as y increases. Preferably, in the near-infrared luminescent material, the proportion of the activator ion $Yb^{3+}$ to the sensitizer ion $Cr^{3+}$ meets the condition of $0.15 \leq y/x \leq 2$, preferably $0.3 \leq y/x \leq 1$ because the sensitizer ion $Cr^{3+}$ must reach a certain proportion to the activator ion $Yb^{3+}$ to absorb enough visible light and ultraviolet light, and thus to have enough energy to be transferred to the activator ion $Yb^{3+}$, so that near-infrared emission with higher luminous efficiency can be obtained. $Yb^{3+}$ takes up the position of R and $Cr^{3+}$ takes up the position of Q. Preferably, in the near-infrared luminescent material, $1.2 \leq (v+x)/(u+y) \leq 1.65$. Further preferably, in the near-infrared luminescent material, $1.45 \leq (v+x)/(u+y) \leq 1.60$. The luminescent material prepared according to this preferred proportion has a purer phase and a more stable crystal lattice structure. Thus, near-infrared emission with higher luminous efficiency is obtained.

The luminescent material provided by the present invention can be prepared by known methods in the art, for example, a high-temperature solid-state method. Preferably, raw materials including an oxide, a fluoride, a carbonate or a chloride of R, an oxide, a fluoride, a carbonate or a chloride of Q, an oxide, a fluoride or a carbonate of Cr and an oxide, a fluoride or a carbonate of Yb are accurately weighed according to a stoichiometric proportion, and are roasted for 2 h to 20 h in an air, nitrogen and/or hydrogen atmosphere to obtain a roasted product. The roasted product is subjected to aftertreatment to obtain a required fluorescent powder. The aftertreatment includes crushing, washing (water washing, weak acid washing or the like), grading, etc.

The prepared light-emitting device includes a phosphor and an excitation light source. The phosphor includes the near-infrared luminescent material. Preferably, the light-emitting device includes a semiconductor chip, a light conversion portion I and a light conversion portion II. The light conversion portion I absorbs primary light emitted by the semiconductor chip and converts the absorbed primary light into secondary light with a larger wavelength. The light conversion portion II absorbs the primary light from the semiconductor chip and the secondary light emitted by the light conversion portion I and converts the absorbed light into thrice light with a larger wavelength. The light conversion portion I at least includes a luminescent material I. The light conversion portion II at least includes the near-infrared luminescent material described above. Under excitation of the semiconductor chip, the luminescent material I is capable of emitting light with a peak wavelength of 580 nm to 650 nm. Preferably, in the light-emitting device, the semiconductor chip has emission peak wavelength ranges of 350 nm to 500 nm and 550 nm to 700 nm. Further preferably, in the light-emitting device, the semiconductor chip has an emission peak wavelength range of 430 nm to 465 nm.

Beneficial effects of the present invention will be further described below with reference to specific embodiments.

Embodiment 1

A near-infrared luminescent material provided by the present embodiment includes an inorganic compound with a formula of $Y_{2.92}Ga_{4.4}O_{11.25}$: $Cr_{0.10}$, $Yb_{0.08}$.

The near-infrared luminescent material provided by the present embodiment takes $Y_2O_3$, $Ga_2O_3$, $Cr_2O_3$ and $Yb_2O_3$ as raw materials. The raw materials are accurately weighed according to the stoichiometric proportion of $Y_{2.92}Ga_{4.4}O_{11.25}$: $Cr_{0.10}$, $Yb_{0.08}$, and are roasted for 5 h in air at 1,400° C. to obtain a roasted product. The roasted product is crushed, washed and dried to obtain the required luminescent material.

The tested excitation spectrum of the luminescent material with a monitoring wavelength of 1,025 nm is as shown in FIG. 1. As can be seen from FIG. 1, the prepared luminescent material in the present embodiment can be effectively excited within the ranges of 250 nm to 300 nm, 400 nm to 500 nm and 550 nm to 700 nm. It not only can be excited by near ultraviolet light, blue light and red light but also has very strong broadband absorption to ultraviolet light, blue light and red light, and thus, can be widely applied.

Figure 2:
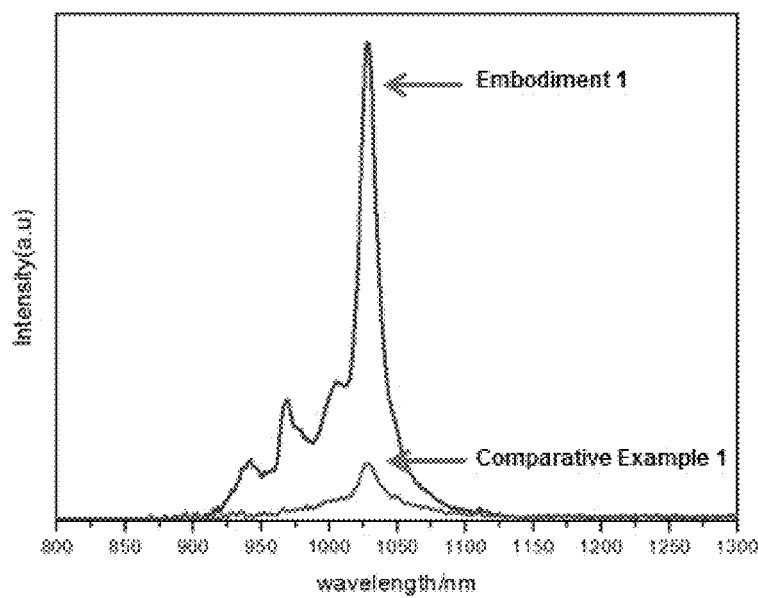
FIG. 2 is an emission spectrum chart of the near-infrared luminescent material with an excitation wavelength of 460 nm according to Embodiment 1 and a material according to Comparative Example 1.

An emission spectrum of the prepared luminescent material under the excitation of a 460 nm light source is as shown in FIG. 2. Thus, the luminescent material has a relatively higher near-infrared light emission intensity.

COMPARATIVE EXAMPLE 1

A near-infrared fluorescent powder in the comparative example includes a compound with the formula of $Y_{2.9}Ga_5O_{12}$:$Yb_{0.10}$.

$Y_2O_3$, $Ga_2O_3$ and $Yb_2O_3$ and a fluxing agent $BaF_2$ are accurately weighed according to the stoichiometric proportion of $Y_{2.9}Ga_5O_{12}$:$Yb_{0.10}$ and ground and uniformly mixed to obtain a mixture. The obtained mixture is calcined for 5 h at 1,500° C. to obtain a calcined product after being cooled down. The calcined product is crushed, ground, graded, sieved and washed to obtain a required infrared fluorescent powder sample.

The emission spectrum of the luminescent material in the comparative example under excitation of a 460 nm light source is as shown in FIG. 2. It can be known from FIG. 2 that in comparison with the emission spectrum of the luminescent material in Embodiment 1, as Cr is added, the near-infrared emission intensity of the luminescent material provided by the present invention is improved. The emission peak-peak wavelength is 1,025 nm. When the relative luminous intensity in Comparative Example 1 is set as 100%, the relative luminous intensity in Embodiment 1 is 867%. Owing to energy transfer of $Cr^{3+}$ to $Yb^{3+}$, the luminous intensity of the luminescent material is remarkably improved by 8.67 times.

Embodiment 2

A near-infrared luminescent material provided by the present embodiment includes a compound with the formula of $Y_{3.38}Ga_{4.9}O_{12.66}$: $Cr_{0.10}$, $Yb_{0.06}$.

$Y_2O_3$, $Ga_2O_3$, $Cr_2O_3$ and $Yb_2O_3$ are accurately weighed according to the stoichiometric proportion of $Y_{3.38}Ga_{4.9}O_{12.66}$: $Cr_{0.10}$, $Yb_{0.06}$, and mixed to obtain a mixture. The mixture is ground, uniformly mixed and then calcined for 5 h at 1,500° C. to obtain a roasted product after being cooled down. The roasted product is subjected to such aftertreatment as crushing, grinding, grading, sieving and washing to obtain a near-infrared fluorescent powder sample.

Figure 3:
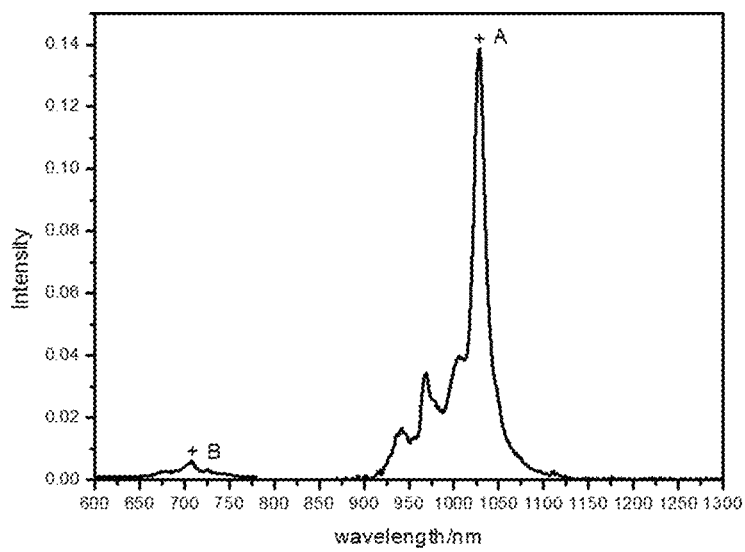
FIG. 3 is an emission spectrum chart of a near-infrared luminescent material with an excitation wavelength of 460 nm according to Embodiment 2 of the present invention.

An excitation test is performed on the obtained near-infrared fluorescent powder sample under an excitation wavelength of 460 nm, wherein the infrared emission spectrum is as shown in FIG. 3. The results shown that under the excitation wavelength of 460 nm, the near-infrared fluorescent powder sample can emit short-wave near-infrared light of 900 nm to 1,100 nm. It can be known from the results of FIG. 3 that the peak-peak intensity of the emission spectrum within the range of 900 nm to 1,100 nm is A, the peak-peak intensity of the emission spectrum within the range of 700 nm to 750 nm is B, and A/(A+B) is about 0.96.

Embodiments 3 to 17

Preparation methods of near-infrared fluorescent powder provided by Embodiments 3 to 17 are similar to those of Embodiments 1 and 2, and their differences are only that according to chemical formulas of target compounds, appropriate amounts of the compounds are mixed, ground and roasted to obtain required near-infrared fluorescent powder materials. The chemical formulas of inorganic compounds of the luminescent materials provided by Embodiments 3 to 17 are as shown in Table 1.

The near-infrared fluorescent powder provided by Embodiments 1 to 17 and Comparative Example 1 are taken for excitation tests. The relative luminous intensities of the near-infrared fluorescent powder at a peak wavelength of 1,025 nm under 460 nm wavelength excitation are measured. The relatively luminous intensity of Comparative Example 1 is set as 100. See Table 1 for the test results.

TABLE 1

Relative Luminous Intensities of Near-infrared Fluorescent Powder at 1,025 nm under 460 nm Wavelength Excitation

| Serial Number | Molecular Formula | Relative Luminous Intensity/% |
|---|---|---|
| Embodiment 1 | $Y_{2.92}Ga_{4.4}O_{11.25}$:$Cr_{0.10}$, $Yb_{0.08}$ | 867 |
| Embodiment 2 | $Y_{3.38}Ga_{4.9}O_{12.66}$:$Cr_{0.10}$, $Yb_{0.06}$ | 851 |
| Embodiment 3 | $Y_{2.97}Ga_{4.9}O_{12}$:$Cr_{0.10}$, $Yb_{0.03}$ | 846 |
| Embodiment 4 | $Y_{2.92}Ga_{3.92}Al_{0.98}O_{12}$:$Cr_{0.10}$, $Yb_{0.08}$ | 820 |
| Embodiment 5 | $Tb_{2.9}Ga_{4.9}O_{12}$:$Cr_{0.10}$, $Yb_{0.10}$ | 817 |
| Embodiment 6 | $Y_{2.72}Tb_{0.20}Ga_{4.7}O_{11.7}$:$Cr_{0.10}$, $Yb_{0.08}$ | 824 |
| Embodiment 7 | $Lu_{2.92}Ga_{4.7}O_{11.7}$:$Cr_{0.10}$, $Yb_{0.08}$ | 842 |
| Embodiment 8 | $Lu_{0.2}Y_{2.72}Ga_{4.4}O_{11.25}$:$Cr_{0.10}$, $Yb_{0.08}$ | 853 |
| Embodiment 9 | $Lu_{2.4}Tb_{0.54}Ga_{4.4}O_{11.25}$:$C_{r0.10}$, $Yb_{0.06}$ | 844 |
| Embodiment 10 | $Y_{3.22}Ga_{5.4}O_{13.2}$:$Cr_{0.10}$, $Yb_{0.08}$ | 819 |
| Embodiment 11 | $Y_{2.9}Ga_{4.7}O_{11.7}$:$Cr_{0.10}$, $Yb_{0.10}$ | 833 |
| Embodiment 12 | $Y_{2.98}Ga_{4.98}O_{12}$:$Cr_{0.02}$, $Yb_{0.02}$ | 812 |
| Embodiment 13 | $Y_{2.94}Al_{4.7}O_{11.7}$:$Cr_{0.10}$, $Yb_{0.06}$ | 776 |
| Embodiment 14 | $Y_{2.7}Ga_{4.2}O_{11.25}$:$Cr_{0.30}$, $Yb_{0.30}$ | 804 |
| Embodiment 15 | $Y_{2.5}Ga_{4.5}O_{11.4}$:$Cr_{0.30}$, $Yb_{0.30}$ | 789 |
| Embodiment 16 | $Y_{3.5}Ga_{4.9}O_{12.84}$:$Cr_{0.10}$, $Yb_{0.06}$ | 801 |
| Embodiment 17 | $Y_3Ga_{5.5}O_{12.93}$:$Cr_{0.06}$, $Yb_{0.06}$ | 768 |
| Comparative Example 1 | $Y_{2.9}Ga_5O_{12}$:$Yb_{0.10}$ | 100 |

It can be seen from the above data that the near-infrared luminescent material can emit near-infrared light with the broadband of 900-1,100 nm. The near-infrared fluorescent powder has a relatively wider excitation wavelength and can well absorb ultraviolet light, blue light and red light. Compared with Comparative Example 1, the near-infrared fluorescent powder has stronger near-infrared luminescence properties.

The near-infrared fluorescent powder prepared in Embodiments 1 to 17 is soaked in water, and then an acid solution is added for ball-milling treatment. Through detection, the properties of the prepared near-infrared fluorescent powder subjected to the treatment are not changed obviously, which indicates that the fluorescent powder has excellent water resistance.

The near-infrared fluorescent powder prepared in Embodiments 1 to 17 is baked in a high-temperature environment. Through detection, the properties of the fluorescent powder are not reduced obviously, which indicates that the prepared fluorescent powder has favorable thermal stability.

Embodiments 15 to 18

Figure 4:
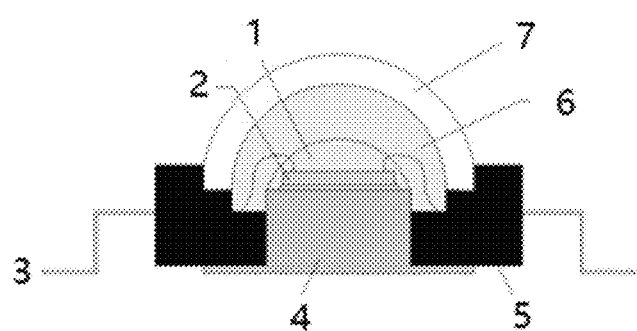
FIG. 4 is a schematic structural view of a light-emitting device according to the present invention.

Embodiments 15 to 18 illustrate a light-emitting device prepared from the near-infrared fluorescent powder material. That is, taking the structure of a light-emitting device in the prior art as an example. FIG. 4 is a schematic structural view of the light-emitting device provided by the present invention. The light-emitting device includes a base 5, and is provided with a heat sink 4 and a pin 3. A light source of the light-emitting device is semiconductor chip 2. An optical material portion of the light-emitting device includes a light conversion portion I and a light conversion portion II. A plastic lens 7 is disposed on the outer layer of the optical material portion. The light conversion portion I absorbs primary light emitted by the semiconductor chip 2 and converts the absorbed primary light into secondary light with a larger wavelength. The light conversion portion II absorbs the primary light from the semiconductor chip 2 and the secondary light emitted by the light conversion portion I, and converts the absorbed light into thrice light with a larger wavelength.

The light-emitting device in Embodiments 15 to 18 is only selectively provided with the light conversion portion II or is provided with both the light conversion portion I and the light conversion portion II. The light conversion portion I at least includes a luminescent material capable of emitting light with a peak wavelength of 580 nm to 650 nm. The light conversion portion II at least includes the near-infrared luminescent material provided by the present invention.

The luminous efficiency of the light-emitting device in the following Embodiments 15 to 18 takes the light-emitting device that includes the fluorescent material as the luminescent material of Comparative Example 1 as a comparison device. The comparison device takes the semiconductor chip with the peak wavelength of 460 nm as the light source and only includes the light conversion portion II. The light conversion portion II includes the near-infrared fluorescent powder of Comparative Example 1. The fluorescent powder absorbs the blue light of a light source, and emits near-infrared light with the peak wavelength of 1,025 nm. The luminous efficiency is set as 100%.

TABLE 2

Structural Information and Relative Luminous Efficiency of Light-emitting Device of Present Invention

| Serial Number | Peak Wavelength of Chip/nm | Light Conversion Portion Material | Peak Wavelength/nm | Material of Light Conversion Portion II | Relative Luminous Efficiency |
|---|---|---|---|---|---|
| Embodiment 15 | 460 | | | Embodiment 1 | 771 |
| Embodiment 16 | 460 | $Ca_{0.992}AlSiN_3:0.008Eu$ | 650 | Embodiment 2 | 646 |
| Embodiment 17 | 460 | $Ca_{0.49}Sr_{0.49}AlSiN_3:0.02Eu$ | 645 | Embodiment 3 | 623 |
| Embodiment 18 | 460 | $Sr_{1.97}Si_5N_8:0.03Eu$ | 625 | Embodiment 4 | 612 |
| Comparison | 460 | | | Comparative Example 1 | 100 |

It can be known from the data in the above Table that the light-emitting device prepared from the near-infrared fluorescent powder material is higher in luminous efficiency.

It is apparent that the above-described embodiments are merely illustrative of the examples, and are not intended to limit the implementation modes. Other variations or modifications in different forms may be made by those of ordinary in the art based on the above description. There is no need and no way to exhaust all of the implementation modes. Obvious changes or variations resulting therefrom are still within the scope of protection of the present invention.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A near-infrared luminescent material, comprising an inorganic compound with a chemical formula of $R_uQ_vO_w$:$Cr_x$, $Yb_y$, wherein
R is at least one of Y, Lu and Tb;
Q is Ga and/or Al; and
the parameters u, v, w, x and y meet the following conditions: $2.5 \leq u \leq 3.5$, $3.5 \leq v \leq 5.5$, $11.25 \leq w \leq 13.25$, $0.02 \leq x \leq 0.30$, and $0.02 \leq y \leq 0.30$;
the near-infrared luminescent material is garnet structure;
the near-infrared luminescent material has a peak-peak intensity A in an emission spectrum within the range of 900 nm to 1,100 nm, and a peak-peak intensity B in an emission spectrum within the range of 700 nm to 750 nm, wherein $0.95 \leq A/(A+B) \leq 0.99$.

2. The near-infrared luminescent material according to claim 1, wherein Q is Ga.

3. The near-infrared luminescent material according to claim 1, wherein Q is a combination of Ga and Al, a mole percent of Ga to Al is j, and 80%≤j<100%.

4. The near-infrared luminescent material according to claim 1, wherein R is Y, Tb or Lu; or R is a combination of Y and Tb or a combination of Y and Lu.

5. The near-infrared luminescent material according to claim 1, wherein R comprises Tb and/or Lu.

6. The near-infrared luminescent material according to claim 1, wherein the parameters x and y meet the following condition: 0.15≤y/x≤2, preferably, 0.3≤y/x≤1.

7. The near-infrared luminescent material according to claim 1, wherein the parameters u, v, x and y meet the following condition: 1.2≤(v+x)/(u+y)≤1.65, preferably, 1.45≤(v+x)/(u+y)≤1.60.

8. The near-infrared luminescent material according to claim 1, further comprising Ba and/or F.

9. A light-emitting device, comprising a phosphor and an excitation light source, wherein the phosphor comprises the near-infrared luminescent material of claim 1.

10. The light-emitting device according to claim 9, comprising a semiconductor chip, a light conversion portion I and a light conversion portion II, wherein the light conversion portion I absorbs primary light emitted by the semiconductor chip and converts the absorbed primary light into secondary light with a larger wavelength; the light conversion portion II absorbs the primary light from the semiconductor chip and the secondary light emitted by the light conversion portion I and converts the absorbed light into thrice light with a larger wavelength; and the light conversion portion I at least comprises a luminescent material I, and the light conversion portion II at least comprises the near-infrared luminescent material of claim 1.

11. The light-emitting device according to claim 10, wherein under excitation of the semiconductor chip, the luminescent material I is capable of emitting light with a peak wavelength of 580 nm to 650 nm.

12. The light-emitting device according to claim 10, wherein the luminescent material I is one or two of luminescent materials with following general formulas: $M_m j1_n SiBN_c:Eu_d$ and $M_e Si_f N_g:Eu_n$; M is selected from Ca and/or Sr; and the parameters m, a, b, c, d, e, f, g and n meet the following conditions: 0.8≤m≤1.2, 0.8≤a≤1.2, 0.8≤b≤1.2, 2≤c≤4, 0.0001≤d≤0.1, 1.8≤e≤2.2, 4≤f≤6, 7≤g≤9, and 0.0001≤n≤0.1.

13. The light-emitting device according to claim 1, wherein the luminescent material I adopts a crystal structure as $CaAlSiN_3$ or $Sr_2Si_5N_8$.

14. The light-emitting device according to claim 1, wherein in the luminescent material 1, M is a combination of Ca and Sr, a mole percent of Sr to M is z, and 80%≤z<100%.

15. The light-emitting device according to claim 1, wherein the semiconductor chip (2) has an emission peak wavelength range of 350 nm to 500 nm and/or 550 nm to 700 nm, preferably 430 nm to 465 nm.

16. The near-infrared luminescent material according to claim 2, wherein R is Y, Tb or Lu; or R is a combination of Y and Tb or a combination of Y and Lu.

17. The near-infrared luminescent material according to claim 3, wherein R is Y, Tb or Lu; or R is a combination of Y and Tb or a combination of Y and Lu.

18. The near-infrared luminescent material according to claim 2, wherein R comprises Tb and/or Lu.

19. The near-infrared luminescent material according to claim 3, wherein R comprises Tb and/or Lu.

20. The near-infrared luminescent material according to claim 2, wherein the parameters x and y meet the following condition: 0.15≤y/x≤2, preferably, 0.3≤y/x≤1.

\* \* \* \* \*